(12) United States Patent
Yu et al.

(10) Patent No.: US 7,327,575 B2
(45) Date of Patent: Feb. 5, 2008

(54) LOCKING DEVICE FOR HEAT SINK

(75) Inventors: Fang-Xiang Yu, Shenzhen (CN);
Shu-Ho Lin, Tu-Cheng (TW);
Meng-Tzu Lee, Tu-Cheng (TW)

(73) Assignees: Fu Zhun Precision Industry (Shenzhen) Co., Ltd., Bao'an District, Shenzhen, Guangdong Province (CN); Foxconn Technology Co., Ltd., Tu-Cheng City, Taipei Hsien (TW)

( * ) Notice: Subject to any disclaimer, the term of this patent is extended or adjusted under 35 U.S.C. 154(b) by 293 days.

(21) Appl. No.: 11/062,200

(22) Filed: Feb. 18, 2005

(65) Prior Publication Data

US 2005/0219823 A1 Oct. 6, 2005

(30) Foreign Application Priority Data

Mar. 30, 2004 (CN) .................. 2004 2 0044383

(51) Int. Cl.
*H05K 7/20* (2006.01)
*F28F 7/00* (2006.01)
*H01L 23/34* (2006.01)

(52) U.S. Cl. ............ 361/719; 361/704; 361/709; 174/16.3; 165/80.3; 257/718; 257/719

(58) Field of Classification Search ............ 361/704, 361/707, 709–711, 715–719, 722; 174/16.3; 165/80.2, 80.3, 185; 257/718, 719, 722; 24/457

See application file for complete search history.

(56) References Cited

U.S. PATENT DOCUMENTS

| | | | | |
|---|---|---|---|---|
| 5,477,916 A | * | 12/1995 | Lin | 165/80.3 |
| 5,493,475 A | * | 2/1996 | Lin | 361/710 |
| 5,581,442 A | * | 12/1996 | Morosas | 361/704 |
| 6,404,633 B1 | * | 6/2002 | Hsu | 361/703 |
| 6,449,157 B1 | * | 9/2002 | Chu | 361/704 |
| 6,473,306 B2 | * | 10/2002 | Koseki et al. | 361/704 |
| 6,574,109 B1 | * | 6/2003 | McHugh et al. | 361/719 |
| 6,618,253 B1 | * | 9/2003 | Szu et al. | 361/719 |
| 6,722,909 B1 | * | 4/2004 | McHugh et al. | 439/331 |
| 6,768,641 B2 | * | 7/2004 | Li | 361/719 |
| 7,009,844 B2 | * | 3/2006 | Farrow et al. | 361/704 |
| 7,142,430 B2 | * | 11/2006 | Lee et al. | 361/719 |
| 2003/0024081 A1 | * | 2/2003 | Chuang et al. | 24/457 |
| 2005/0180114 A1 | * | 8/2005 | Zhou et al. | 361/704 |

* cited by examiner

FOREIGN PATENT DOCUMENTS

CN 95206578.9 12/1996

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq

(57) ABSTRACT

A locking device (10) for securing a heat sink (20) to a heat generating component (30) includes a pair of operating members (14) and a pair of locking members (16). Each operating member includes a pivot shaft (142) defining an axis and an operation handle (144) extending from the pivot shaft along a first direction. The pivot shaft has an offset section (146) offsetting from the axis thereof in a second direction. The first direction and the second direction form an angle therebetween. Each locking member is attached to the offset section of one of the operating members. The operation handle of each operating member is capable of rotating about the axis of the pivot shaft from an unlocked position to a locked position and accordingly the offset section of the pivot shaft drives the locking member to move upwardly.

16 Claims, 5 Drawing Sheets

LOCKING DEVICE FOR HEAT SINK

TECHNICAL FIELD

The present invention relates generally to locking devices, and more particularly to locking devices for securing a heat sink to a heat generating component such as a central processing unit (CPU).

BACKGROUND

It is widely acknowledged that heat is produced during operations of electronic devices such as central processing units (CPUs). The heat produced must be quickly removed to ensure the CPUs working normally. Typically, a heatheat sink to a CPU, especially nowadays the heat sink being made heavier and heavier aiming to obtain a high heat dissipating capacity.

In earlier times, linear-type locking devices were widely used for securing of heat sinks. A linear-type locking device, which is integrally made from a resilient metal wire, generally includes an elongated central pressing portion and a pair of locking arms extending from opposite ends of the elongated central pressing portion in opposite directions to thereby form a Z-shaped configuration. When assembled, the elongated central pressing portion of the linear-type locking device lodges in a heat sink, and the locking arms thereof are then resiliently deflected downwardly to engage with positioning means provided on a frame or socket to thereby secure the heat sink to a CPU. An example of a linear-type locking device is shown in U.S. Pat. No. 5,386,338. However, a linear-type locking device generally has a slim structure, it cannot firmly secure a heat sink to a CPU, especially nowadays the heat sink being made heavier and heavier aiming to obtain a high heat dissipating capacity.

In order to overcome the disadvantage of the above-mentioned linear-type locking devices, plate-type locking devices have been developed. An example of a plate-type locking device is shown in U.S. Pat. No. 6,118,661. The disclosed plate-type locking device has generally a M-shaped configuration and includes a V-shaped central pressing portion for pressing against a heat sink and a pair of locking feet extending downwardly from opposite ends of the V-shaped central pressing portion for respectively engaging with a pair of protrusions provided at a socket mounted on a printed circuit board (PCB). The plate-type locking device is integrally formed and therefore has a large rigidity, and accordingly, large force is needed to operate the plate-type locking device in assembly. When large force is applied, the plate-type locking device is prone to slide over the protrusions of the socket, which will possibly damage other electronic devices mounted on the PCB.

SUMMARY OF THE INVENTION

Accordingly, an object of the present invention is to provide a locking device which can firmly and easily mount a heat sink to a heat generating component.

In order to achieve the object set out above, a locking device in accordance with a preferred embodiment of the present invention comprises a pair of operating members and a pair of locking members. Each operating member includes a pivot shaft defining an axis and an operation handle extending from the pivot shaft along a first direction. The pivot shaft has an offset section offsetting from the axis thereof in a second direction. The first direction and the second direction form an angle therebetween. Each locking member is attached to the offset section of one of the operating members. The operation handle of each operating member is capable of rotating about the axis of the pivot shaft from a first position to a second position to cause the offset section of the pivot shaft to drive the associated locking member to move along a third direction.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
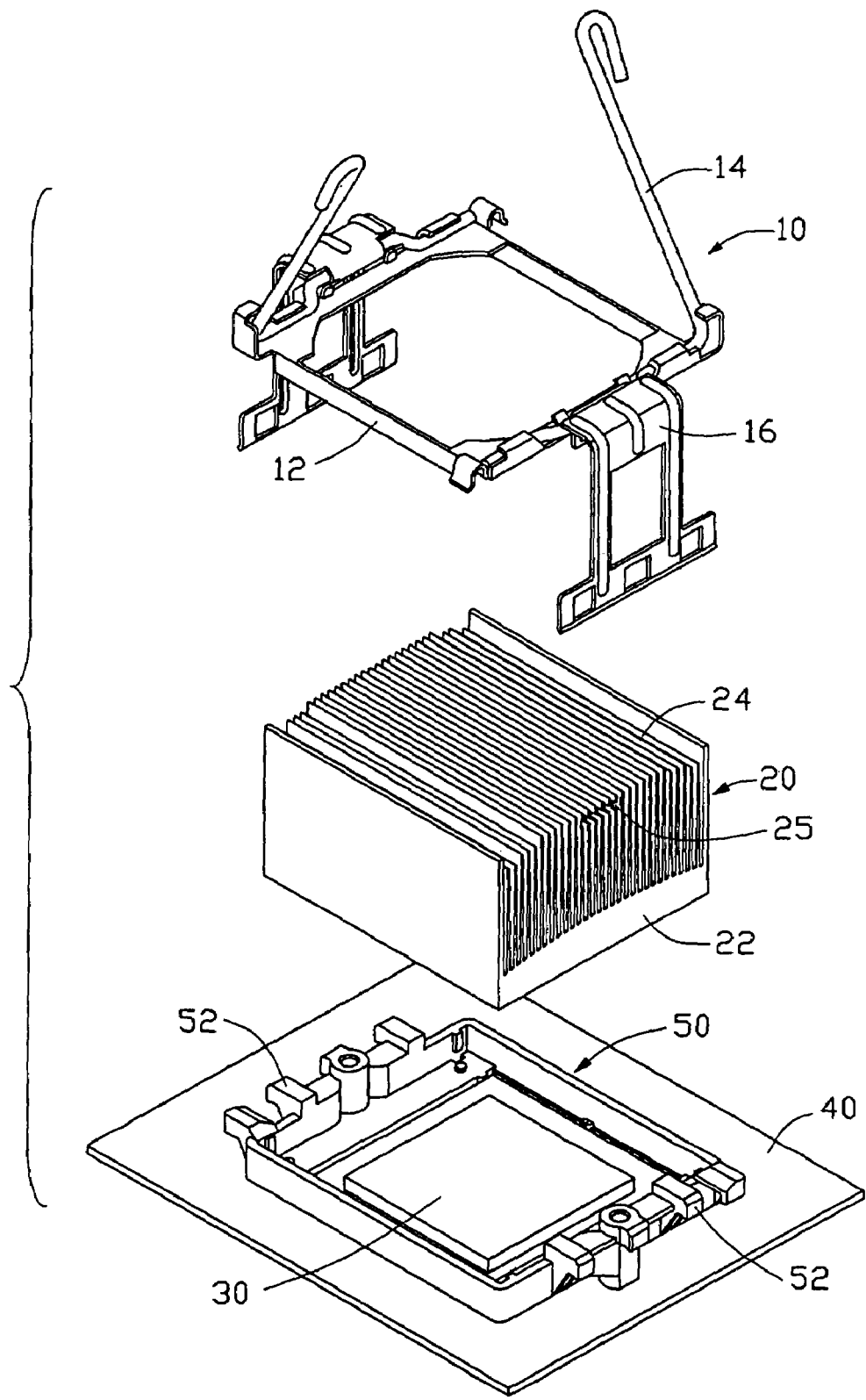
FIG. 1 is an isometric view of a locking device according to a first preferred embodiment of the present invention in combination with related components.

Reference will now be made to the drawing figures to describe the present invention in detail.

FIG. 1 illustrates a locking device 10 of a heat dissipating device according to a first preferred embodiment of the present invention, for securing a heat sink 20, as the main-part of heat dissipation, to a heat generating component such as a CPU 30 which is mounted on a PCB 40. A retention module 50, as a surrounding of the CPU 30, is mounted on the PCB 40 surrounding the CPU 30. A plurality of protrusions 52 is provided at opposite sides of the retention module 50. The heat sink 20 includes a heat-conducting base 22 and a plurality of heat-dissipating fins 24 extending upwardly from the base 22. A pair of horizontal receiving slots 25 (only one visible) is defined at opposite sides of the heat sink 20, each receiving slot 25 crossing plural of fins 24 at a top section thereof.

Figure 2:
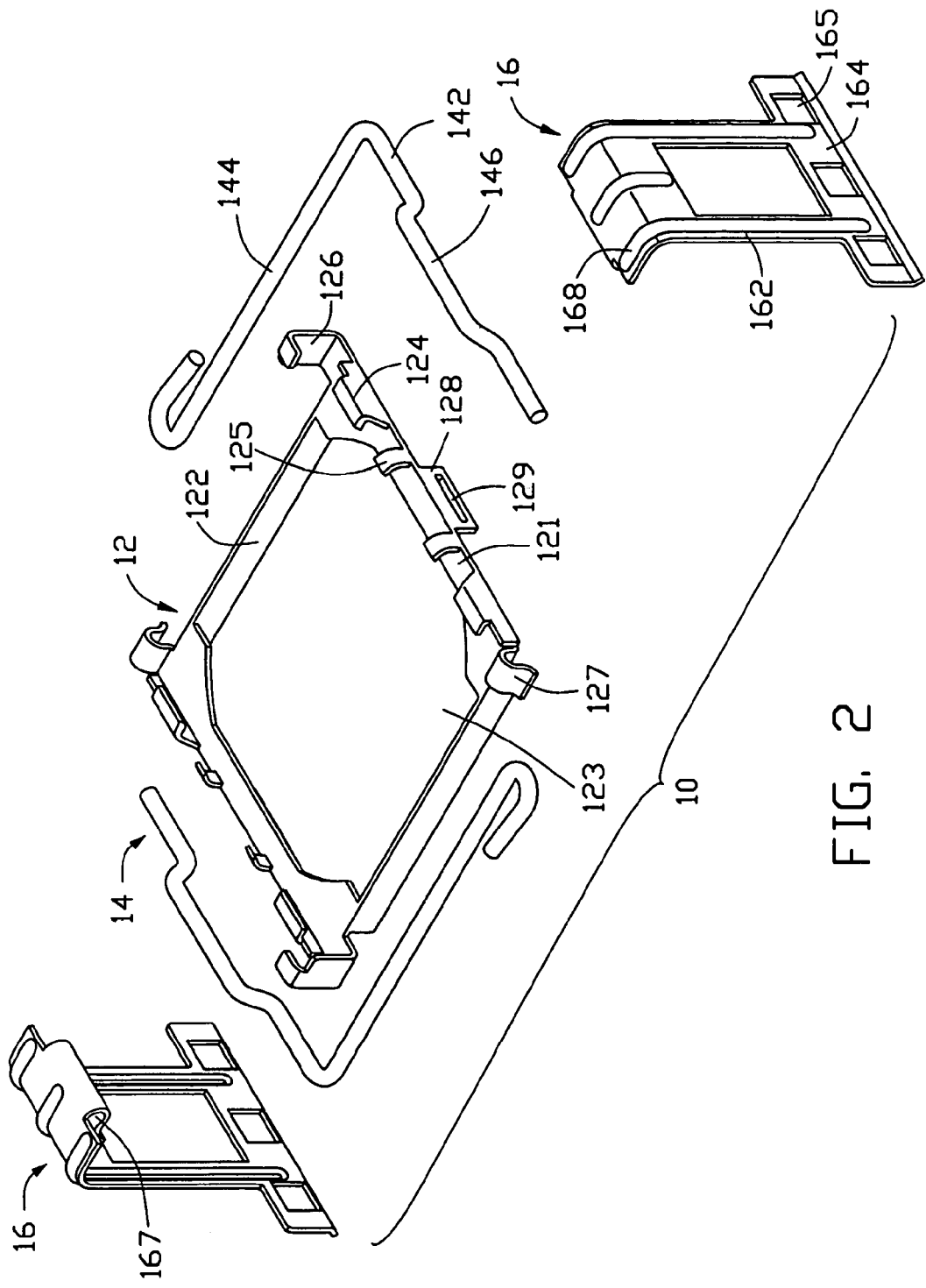
FIG. 2 is an exploded, isometric view of the locking device shown in FIG. 1.

Referring also to FIG. 2, the locking device 10 includes a positioning frame 12, a pair of linear operating levers 14 and a pair of locking feet 16. The positioning frame 12 has a rectangular structure with a pair of horizontal bearing plates 121 and a pair of vertical elongated flanges 122. The bearing plates 121 and the elongated flanges 122 are alternatively connected with each other to cooperatively define a ventilation hole 123 at the center of the positioning frame 12. A pair of spaced positioning tabs 124 extends upwardly from an outer side edge of each bearing plate 121 and is then bent inwardly to thereby define a receiving space (not labeled) between the positioning tabs 124 and the associated bearing plate 121. A pair of spaced, arc-shaped guiding tabs 125 extends upwardly and inwardly from the outer side edge of each bearing plate 121 and is located between the pair of positioning tabs 124. The center of curvature of each guiding tab 125 is located at the axis of the pivot shaft 142. A pair of stopping tabs 126 is formed from a diagonal of the positioning frame 12 and a pair of C-shaped ears 127 is formed from the other diagonal of the positioning frame 12, wherein each stopping tab 126 has a structure similar to the positioning tabs 124. A pair of shortened flanges 128 each extends downwardly from the outer side edge of a corresponding bearing plate 121, wherein only one shortened flange 128 is visible in FIG. 2 due to the isometric view. An engaging means 129 is formed from each shortened flange 128 by punching inwardly, for engaging with the heat sink 20 in a corresponding receiving slot 25.

Each operating lever 14 includes a pivot shaft 142 defining an axis and an operation handle 144 extending perpendicularly from one end of the pivot shaft 142 along a first direction, the pivot shaft 142 and the operation handle 144 cooperatively defining a plane. A central portion of the pivot shaft 142 offsets and projects from the axis of the pivot shaft 142 in a second direction to form an offset section 146 which is located apart from the plane defined by the pivot shaft 142 and the operation handle 144. In this case, an angle, preferably 90 degrees, is formed between the first direction and the second direction. A distal free end of the operation handle 144 is folded back for facilitating operations.

Each locking foot 16 includes a connecting plate 162 and an engaging portion 164 extending from a lower portion of the connecting plate 162. A plurality of retaining holes 165 is defined at the engaging portion 164 for engaging with the protrusions 52 of the retention module 50. An enlarged opening (not labeled) is defined at a center of the connecting plate 162 for reducing the weight and increasing elasticity of the locking foot 16. An upper portion of the connecting plate 162 is bent inwardly and then folded back to thereby form a receiving groove 167. Furthermore, each locking foot 16 has a plurality of ribs 168 formed thereon to reinforce the locking foot 16.

Figure 3:
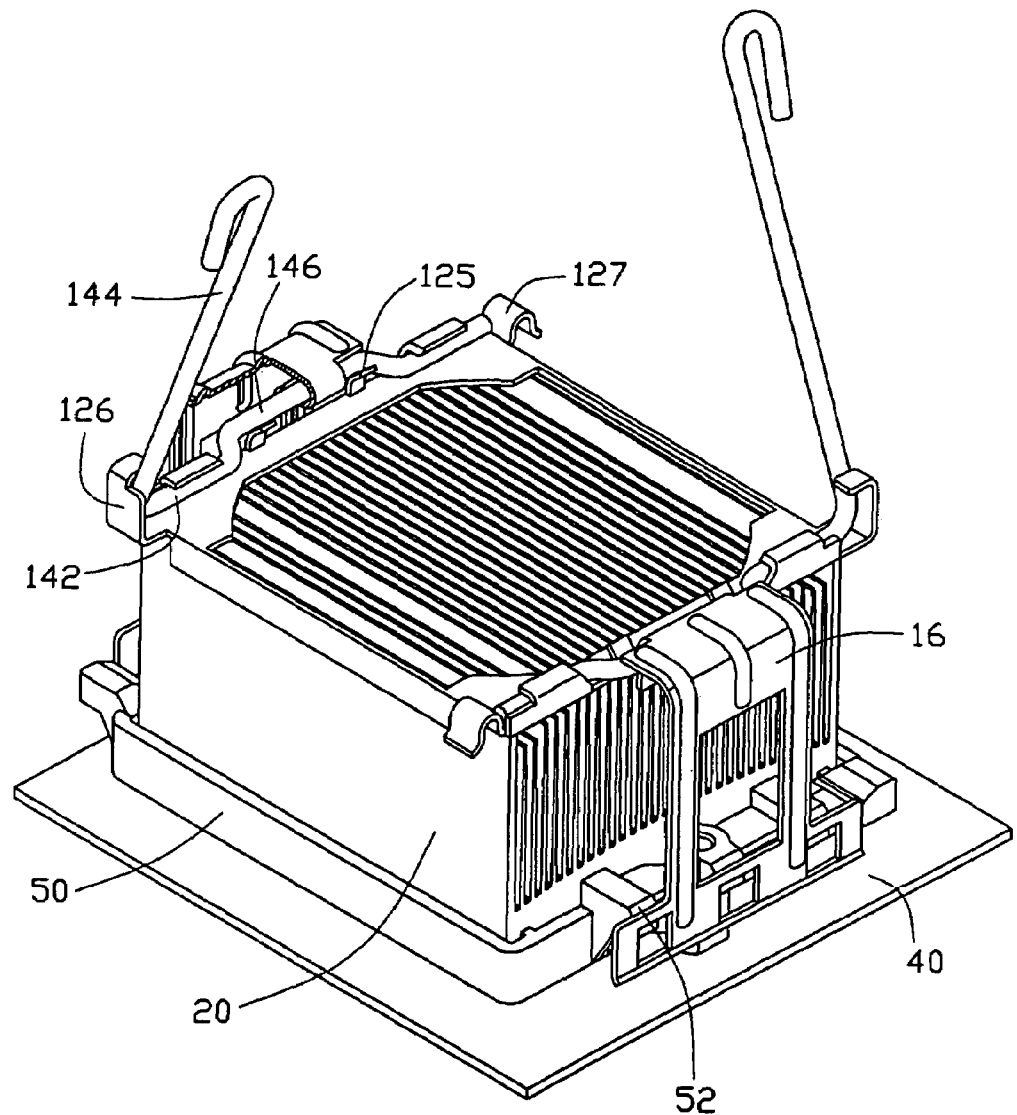
FIG. 3 is an assembled view of FIG. 1 with the locking device located at an unlocked position.
Figure 4:
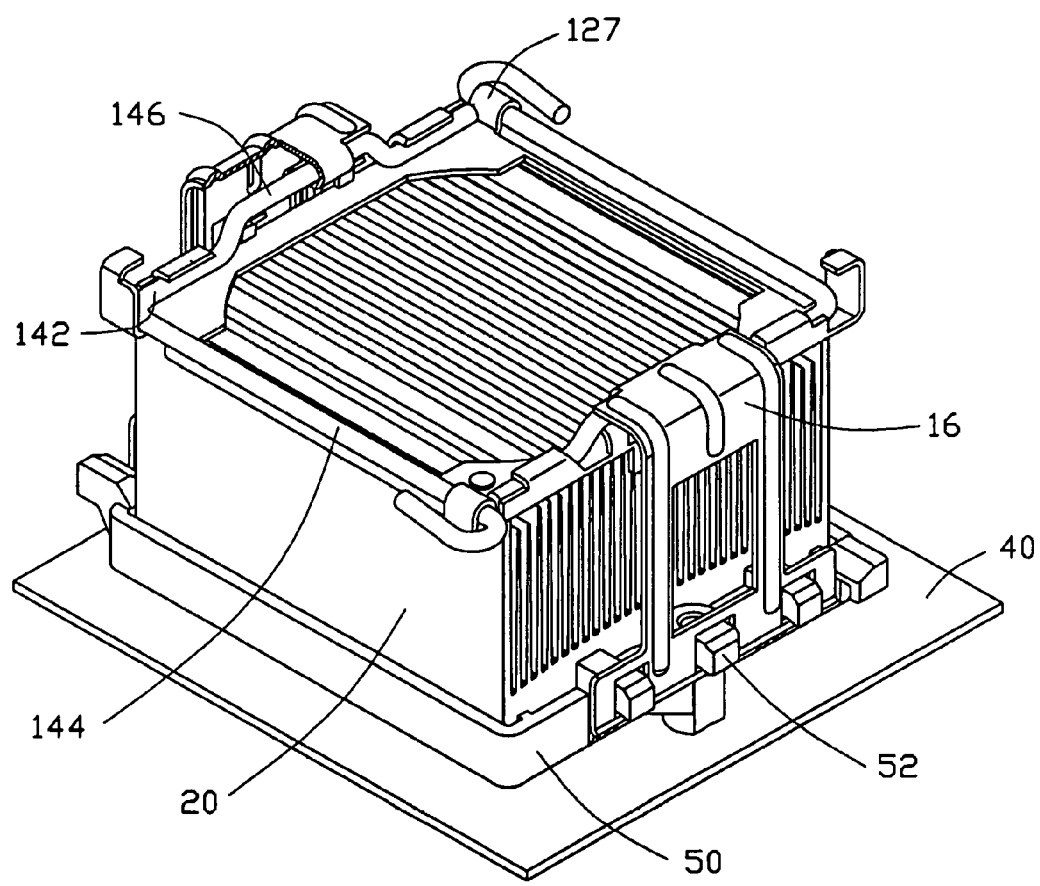
FIG. 4 is an assembled view of FIG. 1 with the locking device located at an locked position.

Referring to FIGS. 1-2, in assembly, each operating lever 14 is combined to a corresponding locking foot 16 by the offset section 146 thereof snappingly and fittingly received in the receiving groove 167 of the locking foot 16. Then, the operating levers 14, each incorporating a locking foot 16, are attached to opposite sides of the positioning frame 12 respectively. The pivot shaft 142 of each operating lever 14 is lodged in the receiving space defined by the bearing plate 121 and the associated positioning tabs 124. The offset section 146 of each operating lever 14 spans corresponding two guiding tabs 125 with the guiding tabs 125 located at opposite sides of the receiving groove 167 of the locking foot 16 and abutting with the offset section 146. The guiding tabs 125 are to prevent the attached locking foot 16 from moving along the offset section 146 and to guide the rotation of the offset section 146. In this case, the operation handle 144 of each operating lever 14 is capable of rotating about the axis of the pivot shaft 142 from an unlocked position at which the operation handle 144 is stopped by a corresponding stopping tab 126 of the positioning frame 12 to a locked position at which the operation handle 144 stands parallel to the positioning frame 12 and is capable of locking at a corresponding ear 127. As the operation handle 144 rotates from the unlocked position to the locked position, the offset section 146 of the operating lever 14 correspondingly rotates about the axis of the pivot shaft 142 along the corresponding guiding tabs 125 from a lower position to an upper position to thereby drive the associated locking foot 16 to move upwardly Referring to FIGS. 1-4, in operation, the heat sink 20 is seated on the retention module 50. The positioning frame 12 is attached to the heat sink 20 by the elongated flanges 122 and the shorted flanges 128 embracing a top of the heat sink and the engaging means 129 of each shortened flange 128 engaging in a corresponding receiving slot 25 of the heat sink 20. Initially, the operation handle 144 of each operating lever 14 is located at its unlocked position and the offset section 146 of each pivot shaft 14 is located at its lower position. The locking feet 16 are located at opposite sides of the heat sink 20 with the retaining holes 165 of each locking foot 16 confronting with the corresponding protrusions 52 of the retention module 50, as shown in FIG. 3. Then, the locking foot 16 is moved to cause the retaining holes 165 to loosely engage with the corresponding protrusions 52 and the operation handle 144 of each operating lever 14 is pushed to rotate with respect to the axis of the pivot shaft 142 toward its locked position. As the operation handle 144 rotates, the offset section 146 of the pivot shaft 142 accordingly moves from its lower position toward its upper position to thereby drive the associated locking foot 16 to move upwardly. When the operation handle 144 is finally located at its locked position and is locked at a corresponding ear 127 of the positioning frame 12, the retaining holes 165 of each locking foot 16 firmly engage with the corresponding protrusions 52 of the retention module 50 and consequently the pivot shaft 142 of each operating lever 14 generates a downward pressing force against the heat sink 20 via the positioning frame 12, as shown in FIG. 4. Thus, the heat sink 20 is firmly secured to the CPU 30. The offset section 146 bears against the guiding tabs 125, which, in turns, provide support to the offset section 146 and a downward force toward the heat sink 20 via the frame 12.

Figure 5:
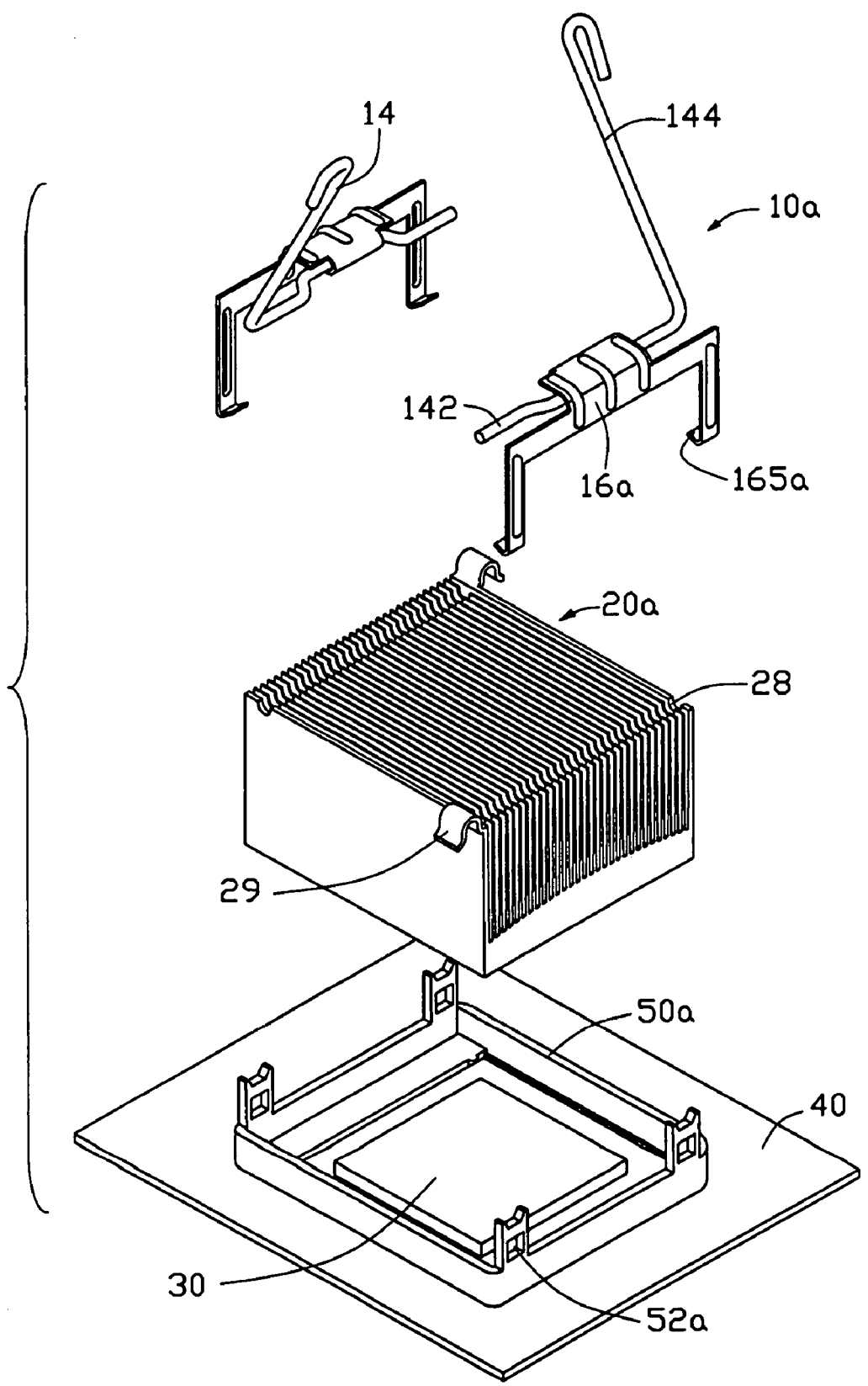
FIG. 5 is an isometric view of a locking device according to a second preferred embodiment of the present invention in combination with related components.

FIG. 5 illustrates a locking device 10*a* according to a second preferred embodiment of the present invention, for securing a heat sink 20*a* to a retention module 50*a*. As compared with the first embodiment, the locking device 10*a* does not include a positioning frame. The locking device 10*a* comprises a pair of locking feet 16*a* each having two separated hooks 165*a* formed at a lower portion thereof A pair of spaced positioning slots 28 is defined at opposite sides of the heat sink 20*a* each for receiving and positioning the pivot shaft 142 of a corresponding operating lever 14. A pair of C-shaped ears 29 is integrally formed from the heat sink 20*a* diagonally. The retention module 50*a* defines at four corners thereof a plurality of retaining holes 52*a* for engaging with the hooks 165*a* of the locking feet 16*a*. When assembled, the pivot shaft 142 of each operating member 14 is positioned at a corresponding positioning slot 28 of the heat sink 20*a* with initially the hooks 165*a* of the locking feet 16*a* loosely engaged with the retaining holes 52*a* of the retention module 50*a*. As the operation handle 144 of each operating member 14 rotates to lock with a corresponding ear 29 of the heat sink 20*a*, the operating member 14 drives the associated locking foot 16*a* to move upwardly to engage with the retention module 50*a* in the retaining holes 52*a* firmly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A locking device for a heat sink comprising:
   an operating member having a pivot shaft defining an axis and an operation handle extending from the pivot shaft along a first direction, the pivot shaft having an offset section offsetting from the axis in a second direction, said first direction and second direction forming an angle therebetween; and a locking member attached to the offset section of the operating member;

wherein the operation handle of the operating member is capable of rotating about the axis of the pivot shaft from a first position to a second position to cause the offset section of the pivot shaft to drive the locking member to move along a third direction;

wherein the locking member includes a connecting plate and an engaging portion extending from a lower portion of the connecting plate; and wherein an upper portion of the locking member is bent inwardly and then folded back to form a receiving groove for fittingly receiving said offset section therein.

2. The locking device of claim 1, wherein the angle is 90 degree.

3. The locking device of claim 1, further comprising a positioning frame with a pair of the operating members rotatably mounted thereto.

4. The locking device of claim 3, wherein the positioning frame comprises at least one tab formed at each of opposite sides thereof and the pivot shaft of each operating member abuttingly slides along said at least one tab located at a corresponding side of the positioning frame when the operation handle rotates from the first position to the second position.

5. An assembly comprising:
a printed circuit board;
a heat generating component mounted on the printed circuit board;
a retention module mounted on the printed circuit board and surrounding the heat generating component;
a heat sink seated upon the heat generating component;
a pair of linear operating members provided above and located at opposite sides of the heat sink, each operating member having a pivot shaft and an operation handle cooperatively defining a plane, an offset section provided at the pivot shaft of the operating member and located apart from said plane; and
a pair of locking members each attached to the offset section of one of the operating members;
wherein an upper portion of each locking member defines a receiving groove for fittingly retaining the offset section of the corresponding operating member therein; and
wherein when the operation handle of each operating member rotates with respect to the heat sink from an unlocked position to a locked position, the offset section of the pivot shaft moves from a lower position to an upper position and drives the associated locking member to move upwardly with respect to and engage with the retention module.

6. The assembly of claim 5, further comprising a positioning frame located above and attached to the heat sink, the operating members being rotatably mounted to opposite sides of the positioning frame.

7. The assembly of claim 6, wherein the positioning frame has a pair of positioning tabs for positioning the pivot shaft of each operating member when mounted thereto.

8. The assembly of claim 7, wherein the positioning frame has a pair of spaced guiding tabs for abutting the offset section of each operating member at opposite sides of the receiving groove of the corresponding locking member.

9. The assembly of claim 5, wherein the receiving groove is defined by bending the upper portion of the locking member inwardly and then folding back.

10. The assembly of claim 6, wherein the positioning frame forms a pair of ears on said opposite sides thereof, each of the ears located at one of said opposite sides of the positioning frame being locked with a corresponding operating member mounted to the other of said opposite sides.

11. The assembly of claim 5, wherein the operating members are attached to the heat sink and are respectively positioned in a pair of positioning slots defined on top of the heat sink.

12. The assembly of claim 11, wherein the heat sink has a pair of ears for locking the operation handle of each operating member at the second position.

13. The assembly of claim 5, wherein an engaging portion is formed from a lower portion of each locking member for engaging with the retention module.

14. An assembly of a heat dissipating device for dissipating heat from a heat generating component, comprising:
a main part capable of thermally contacting with said heat generating component to dissipate said heat from said component;
a frame resting on said main part;
an operating member attached to said frame and rotatable along an axis in said frame, and comprising an offset section disposed at an offset location from said axis and movable with said operating member; and
a locking member attached to said offset section of said operating member and movable along with said offset section, said locking member located in a first position where said locking member is lockable to a surrounding of said heat generating component so as to attach said main part to said component, and a second position where said locking member is away from said surrounding;
wherein when said operating member is rotated to move said offset section so as to move said locking member between said first position and said second position, said offset section provides a force moving said main part toward said component via said frame in case that said locking member is moved to said first position; and
wherein said frame comprises a guiding tab abutting against said offset section of said operating member so as to guide movement of said offset section with said operating member and generate said force to move said main part together with said offset section.

15. The assembly of claim 14, wherein said frame comprising a flange extending toward to said main part and engagable therewith so as to attach said frame to said main part.

16. The assembly of claim 14, wherein said locking member is held freely by said offset section so as to be automatically moved away from said surrounding at said second position of said locking member due to a weight of said locking member after movement of said offset section and said locking member to said second position.

* * * * *